(12) United States Patent
Lashinsky et al.

(10) Patent No.: US 11,515,679 B2
(45) Date of Patent: Nov. 29, 2022

(54) POWER ADAPTER FOR ELECTRONIC DEVICES

(71) Applicant: Apple Inc., Cupertino, CA (US)

(72) Inventors: Matthew A. Lashinsky, San Francisco, CA (US); Arun R. Varma, San Jose, CA (US); Cesar Lozano Villarreal, Campbell, CA (US); Mathieu P. Roy, Los Gatos, CA (US); Balal Khan, Sunnyvale, CA (US); Johnathan D. Simeroth, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 54 days.

(21) Appl. No.: 17/092,022

(22) Filed: Nov. 6, 2020

(65) Prior Publication Data
US 2021/0408743 A1 Dec. 30, 2021

Related U.S. Application Data

(60) Provisional application No. 63/043,773, filed on Jun. 24, 2020.

(51) Int. Cl.
*H01R 31/06* (2006.01)
*H05K 1/18* (2006.01)
(Continued)

(52) U.S. Cl.
CPC ........... *H01R 31/065* (2013.01); *H01R 12/72* (2013.01); *H01R 13/504* (2013.01); *H05K 1/18* (2013.01);
(Continued)

(58) Field of Classification Search
CPC .... H01R 31/065; H01R 12/72; H01R 13/504; H05K 1/18; H05K 5/0052; H05K 5/006
(Continued)

(56) References Cited

U.S. PATENT DOCUMENTS 5,540,596 A * 7/1996 Bothe ................ H01R 13/6675
439/518
5,805,440 A * 9/1998 Maeshima ......... H01R 13/6675
363/146
(Continued)

FOREIGN PATENT DOCUMENTS

CN 202231600 U 5/2012
CN 205752671 U 11/2016
(Continued)

OTHER PUBLICATIONS

Indian Patent Application No. 202114027814—First Examination Report dated Mar. 3, 2022.

*Primary Examiner* — Alexander Gilman
(74) *Attorney, Agent, or Firm* — BakerHostetler

(57) ABSTRACT

A power adapter for powering portable electronic devices is disclosed. The modifications and enhancements to the power adapter can reduce or eliminate the need for adhesives, flexible circuitry, and/or wiring. The power adapter includes multiple guide rails used to guide a circuit board (carrying components) to electrical springs. The electrical springs provide not only an electrical coupling, but also a mechanical coupling. As a result, wiring and/or adhesives is not required. Additionally, a cap is secured to the enclosure through melting part of the cap by, for example, ultrasonic welding without causing damage to the circuit board, as welding location(s) is/are in locations away from the electrical springs and other sensitive components. The power adapter further includes a connector connected to the circuit board. During assembly, the circuit board can pivot in three dimensions during assembly to align the connector with the cap.

20 Claims, 14 Drawing Sheets

(51) Int. Cl.
  *H01R 13/504* (2006.01)
  *H05K 5/00* (2006.01)
  *H01R 12/72* (2011.01)

(52) U.S. Cl.
  CPC ........... *H05K 5/006* (2013.01); *H05K 5/0052* (2013.01); *H05K 2201/09163* (2013.01); *H05K 2201/10189* (2013.01)

(58) Field of Classification Search
  USPC .......................................................... 439/76
  See application file for complete search history.

(56) References Cited

U.S. PATENT DOCUMENTS

| | | | | |
|---|---|---|---|---|
| 6,042,400 A | * | 3/2000 | Queffelec | H01R 13/44 439/131 |
| 6,402,546 B1 | * | 6/2002 | Groves | H02G 11/02 439/501 |
| 6,623,294 B2 | * | 9/2003 | Tse | H01R 13/72 439/4 |
| 6,644,984 B2 | * | 11/2003 | Vista, Jr. | H01R 12/58 439/76.1 |
| 6,851,955 B2 | * | 2/2005 | Chen | H01R 13/6658 439/84 |
| 7,040,931 B1 | * | 5/2006 | Achtner | H01R 9/11 439/651 |
| 7,499,301 B2 | * | 3/2009 | Zhou | H05K 1/0256 439/131 |
| 7,563,139 B1 | * | 7/2009 | Wang | H01R 4/4818 439/638 |
| 7,794,283 B2 | * | 9/2010 | Wang | H01R 13/502 439/651 |
| 7,978,489 B1 | * | 7/2011 | Telefus | H01R 31/065 363/142 |
| 7,983,064 B2 | * | 7/2011 | Zhang | H01R 12/718 439/171 |
| 8,033,867 B1 | * | 10/2011 | Kessler | H01R 27/00 439/652 |
| 8,308,493 B2 | * | 11/2012 | Lim | H01R 24/68 439/76.1 |
| 8,337,250 B1 | * | 12/2012 | Yang | H01R 13/112 439/620.22 |
| 8,342,861 B2 | * | 1/2013 | Stiehl | H01R 24/68 439/695 |
| 8,480,410 B2 | * | 7/2013 | Early | H01R 43/16 439/620.21 |
| 8,608,489 B2 | * | 12/2013 | Nogami | H01R 13/6658 439/377 |
| 8,619,413 B2 | * | 12/2013 | Gausepohl | H01R 13/582 361/679.01 |
| 9,024,581 B2 | * | 5/2015 | McGinley | H02J 7/0042 320/111 |
| 9,236,699 B2 | * | 1/2016 | Lai | H01R 13/665 |
| 9,343,850 B2 | * | 5/2016 | Colahan | H02M 7/04 |
| 10,965,068 B1 | * | 3/2021 | King | H05B 47/19 |
| 2009/0289596 A1 | * | 11/2009 | McGinley | H01R 31/065 320/111 |
| 2021/0408743 A1 | * | 12/2021 | Lashinsky | H05K 7/1417 |

FOREIGN PATENT DOCUMENTS

| | | |
|---|---|---|
| CN | 207234649 U | 4/2018 |
| CN | 209787035 U | 12/2019 |
| JP | 2018183827 A | 11/2018 |

* cited by examiner

POWER ADAPTER FOR ELECTRONIC DEVICES

CROSS-REFERENCE TO RELATED APPLICATIONS

The present application claims the benefit of U.S. Provisional Application No. 63/043,773, entitled "POWER ADAPTER FOR ELECTRONIC DEVICES," filed Jun. 24, 2020, the content of which is incorporated herein by reference in its entirety for all purposes.

FIELD

The following description relates to power adapters. In particular, the following description relates to enhancements to power adapters that enhance efficiency of assembly, safety, cost, and performance.

BACKGROUND

Adapters can be used to supply power to electronic devices. Typical adapters can be plugged into a wall to receive electrical energy. Some adapters include circuitry used to convert AC to DC, monitor current flow, and provide indicators (e.g., lights). In order to assemble the various pieces of the adapter together, common adapters require adhesives, wires, and/or fasteners.

However, the aforementioned assembly techniques for current adapters provide drawbacks. For instance, using any one of adhesives, wires, or fasteners can add cost to the adapter in terms of parts and/or labor. Furthermore, adhesives tend to fix parts together without the possibility of adjusting/moving the parts during assembly.

SUMMARY

In one aspect, a power adapter for electronic devices is described. The power adapter may include an enclosure that defines an internal volume. The power adapter may further include a circuit board located in the internal volume. The circuit board may include a rib. The power adapter may further include a cap that includes a fin that interlocks with the rib.

In another aspect, a power adapter for electronic devices is described. The power adapter may include an enclosure that defines an internal volume. The enclosure may include a first wall and a second wall. The power adapter may further include an electrical spring secured with the first wall. The power adapter may further include a first guide rail extending from the first wall. The power adapter may further include a second guide rail extending from the second wall. The power adapter may further include a circuit board positioned in the internal volume between the first guide rail and the second guide rail. The circuit board may be electrically coupled to the electrical spring.

In another aspect, a power adapter for electronic devices is described. The power adapter may include an enclosure that defines an internal volume. The enclosure may include a first end defined by a wall and a second end defined by an opening. The second end may be opposite the first end. The power adapter may further include electrical springs coupled with the wall. The power adapter may further include a cap coupled with the opening. The cap may include a cap opening. The power adapter may further include a circuit board disposed in the internal volume and electrically coupled to the electrical springs. The power adapter may further include a connector carried by the circuit board, the connector positioned in the cap opening.

Other systems, methods, features and advantages of the embodiments will be, or will become, apparent to one of ordinary skill in the art upon examination of the following figures and detailed description. All such additional systems, methods, features and advantages shall be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
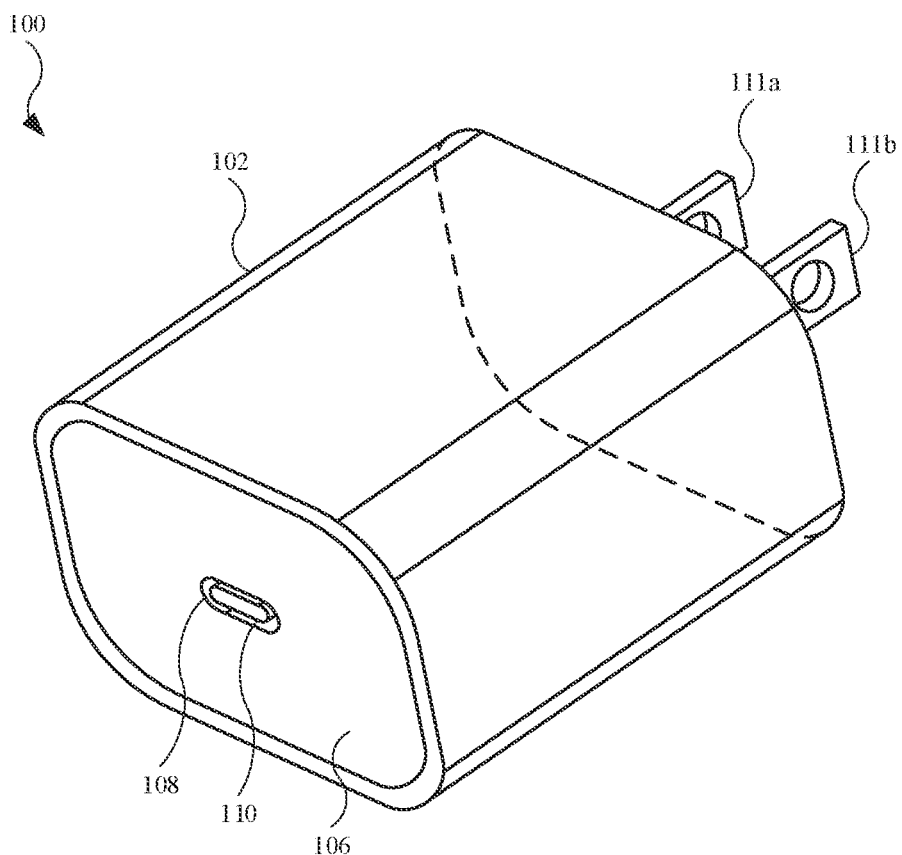
FIG. 1 illustrates an isometric view of an embodiment of a power adapter.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to adapters, such as power adapters, used to supply electrical energy to portable electronic devices including mobile wireless communication devices, laptop computing devices, and tablet computing devices (as non-limiting examples). In particular, the adapters described herein rely on modifications that can limit or remove the need for traditional materials, such as adhesives and wiring. Additionally, the adapters described herein include certain components (such as a circuit board and a connector) that can move relative to other parts in order to provide a desired alignment of the connector.

The adapters described herein relies in part on forcing an interference fit between two components of the adapter. The component materials may include a cap formed from a thermoplastic (e.g., polycarbonate) and a circuit board formed from a thermoset (e.g., FR4). During an assembly operation using welding (e.g., ultrasonic welding), mechanical energy is applied to the cap, causing a region of the cap to melt around the circuit board. The ultrasonic welding "horn" provides mechanical energy, usually in the range of 20-30 kHz. Based on the different material makeup, the circuit board, having a higher melting temperature than that of the cap, does not melt when the thermal energy is applied. Due in part to the melting around the circuit board, no gaps remain between the cap and the circuit board when the melted region of the cap solidifies, creating a mechanical constraint along the axis of welding, as well as an axis perpendicular to the axis of welding. The mechanical constraint absorbs the gaps, despite tolerance variations, without the use of adhesives. The resulting plastic geometry forms a line-to-line interface with the circuit board. Also, the thermoplastic selected for the cap may include a relatively higher melting temperature, as compared to other external components of power adapters. As a result of the higher melting temperature, the cap melts in a predictable manner and does not flow into undesired areas. Accordingly, some processes described herein reduce the reliance on additional adhesives to constrain the circuit board after the welding operation, thereby reducing the costs associated with adhesives, which include the material and the equipment required to dispense. However, adhesives can be used in other applications, i.e., not between the circuit board and the enclosure or between the cap and the enclosure, to allow adhesive dispensing without affecting the welding operation. This should not be construed as limiting, and in some embodiments, adhesives can be used between the circuit board and the enclosure, and/or between the cap and the enclosure.

Adapters described herein may further include blind mate electrical connections with consistent contact force. The blind mate electrical connections may include electrical springs that create a robust electrical connection in a difficult-to-access location, such as at the bottom of a power adapter enclosure. The electrical springs eliminate the need for long wire service loops to connect the circuit board to the metal prongs of the adapter. Moreover, the enclosure can be modified with features to guide the circuit board through the enclosure during assembly, and further guide the circuit board to the electrical springs, including centering the circuit board with respect to the electrical springs. Additionally, the electrical springs ensure consistent contact force and low electrical impedance. Also, the aforementioned welding operation is performed away from the electrical springs, thereby reducing the likelihood of issues of damage to the electrical springs, as well as damage to components or loosening of components, particularly during assembly. For example, the cap, which undergoes a welding operation, is secured to one end of the enclosure, while the electrical springs are located at the other, opposing end of the enclosure away from the location of the welding operation. Also, by eliminating wiring, the electrical connections are simplified, and the manual labor (and associated manufacturing time) associated with wiring is eliminated. This not only reduces the required manufacturing time, but also reduces the total part count. As a result, the processes described herein enhance safety by reducing variation assembly states and circuit board to electrical spring (and housing) freedom of motion, which can reduce stress and wear on connections. By reducing variation assembly states, the likelihood of faulty assembly is reduced. Accordingly, the processes described herein provide benefits over the use of wired connections and associated issues with the wired connections.

Adapters described here may further include self-aligning input-output ("I/O"), thereby allowing gap control at different interfaces. For example, the enclosure is modified to include a pivot rib, thus defining a pivot point for the circuit board. The pivot rib allows for a translation constraint, but allows rotation of circuit board about the pivot rib in multiple directions. As a result, the circuit board can align with the cap at the interface between a connector (connected to the circuit board) and a cap opening in which the connector is located. The self-aligning feature enhances cosmetic and functional alignment of the connector without requiring a flexible printed circuit board ("PCB") connection. As a result, the processes described herein can contribute to reduce parts and associated costs, as well as the elimination of relatively high heat welding operations, such as laser welding, which is often required to reliably secure a flexible printed circuit ("FPC") connector to mating enclosure parts.

Adapters described here may further include an ultrasonic weld joint between cosmetic parts (e.g., the enclosure and the cap) that provides a balance between joint mechanical strength and cosmetic quality. Traditional shear welds tend to have inefficiencies with respect to using all of the space/volume created for joint strength, allowing for overflow out of the space/volume for increased weld strength. However, the cap can be modified to include a flange that extends similar to a ring around an inner surface of the cap such that the flange extends beyond the weld plane. The flange can be perpendicular, or at least substantially perpendicular, to the weld plane while allowing a small gap (between the enclosure and the flange) for melt overflow. The gap is designed and positioned to redirect and capture the melt overflow in a way that increases weld strength without requiring additional space/volume for the melt overflow. Moreover, the flange hides/covers any melt overflow, thereby increasing the cosmetic appearance of the adapter. The processes described herein can create an enhanced weld strength by as much as 50% without significant risk increase to cosmetics/aesthetics.

These and other embodiments are discussed below with reference to FIGS. 1-16. However, those skilled in the art will readily appreciate that the detailed description given herein with respect to these Figures is for explanatory purposes only and should not be construed as limiting.

FIG. 1 illustrates an isometric view of an embodiment of a power adapter 100. Power adapter 100 may refer to a charger designed to plug into a wall outlet (not shown in FIG. 1), which may include a 110-Volt to 120-Volt ("V") alternating current ("AC") source. In this regard, power adapter 100 is designed to receive AC and convert to direct current ("DC"), and supply DC at a specified level (e.g., 12-Volt DC) to various electronic devices (not shown in FIG. 1), such as mobile wireless communication devices (e.g., smartphones, tablet computing devices), desktop computing devices, and laptop computing devices. Power adapter 100 can be designed to provide a specified amount of power. In this regard, power adapter 100 may also be referred to as a 5-Watt ("W"), a 12-W, 18-W, or a 20-W adapter, as non-limiting examples, depending upon the electronic components (not shown in FIG. 1) of power adapter 100. In some embodiments, power adapter 100 is rated for 100-240 V AC.

As shown, power adapter 100 includes an enclosure 102, defined by several walls. Enclosure 102 may define an internal volume used to carry several components (shown later) of power adapter 100. Enclosure 102 may include a molded enclosure, formed from a polymer (e.g., plastic, as a non-limiting example). Power adapter 100 may further include a cap 106 secured with enclosure 102. Cap 106 includes an opening 108 that receives a connector 110. Connector 110 can be designed in accordance with an industry standard, such as Universal Serial Bus ("USB"), including USB-C (as a non-limiting example). Connector 110 is designed to electrically couple with a cord-cable assembly (not shown in FIG. 1), allowing power adapter 100 to receive electrical energy and supply power to one of the aforementioned electronic devices.

Power adapter 100 may further include a prong 111a and a prong 111b designed to couple with an AC socket. Prongs 111a and 111b may be referred to as a first prong and a second prong, respectively. As shown, prongs 111a and 111b are designed in accordance with a particular design. For instance, prongs 111a and 111b represent two pins that are generally flat and parallel with respect to each other. However, power adapter 100 can be modified for use in accordance with another design that conforms to another industry standard. For instance, in some exemplary embodiments, prongs 111a and 111b are non-parallel prongs. Further, in some exemplary embodiments, power adapter 100 includes three prongs, at least one of which is cylindrical or tubular. Also, in some exemplary embodiments, power adapter 100 is designed for use (in terms of circuitry and power rating) with a 100- to 240-Volt AC source.

Figure 2:
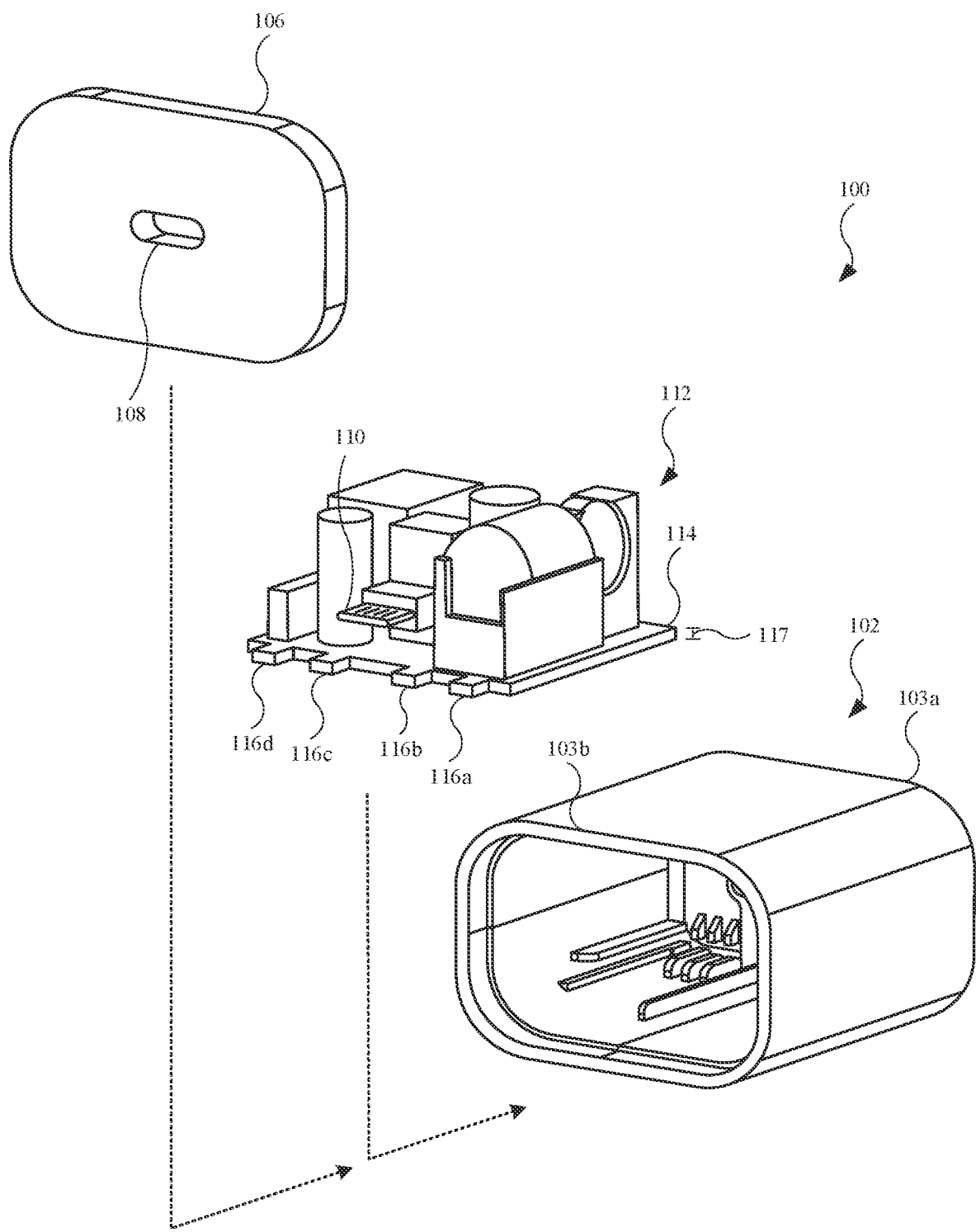
FIG. 2 illustrates an exploded view of the power adapter shown in FIG. 1.

FIG. 2 illustrates an exploded view of power adapter 100 shown in FIG. 1. As shown, enclosure 102 includes an end 103a and an end 103b that is opposite end 103a. End 103a may be generally defined by a wall (not labeled) of enclosure 102 while end 103b is defined by an opening that receives, or at least partially receives, cap 106. Power adapter 100 further includes a subassembly 112, which may include a circuit board 114 (such as a printed circuit board, or PCB) that carries several components, including transistors and an AC-to-DC converter, and connector 110, as non-limiting examples. In this regard, connector 110 may be part of subassembly 112, and electrically coupled to circuit board 114.

As shown, circuit board 114 includes a dimension 117 corresponding to a thickness of circuit board 114. Dimension 117 may be approximately in the range of 0.8 to 1.6 millimeters ("mm"). In some embodiments, dimension 117 is 1.2 mm. As a result of dimension 117 of circuit board 114, strain and other stresses applied to circuit board 114 can be minimized, thereby keeping components, such as a fuse and metal traces, intact. Also, circuit board 114 may include several ribs. For example, circuit board 114 includes a rib 116a, a rib 116b, a rib 116c, and a rib 116d. While a described number of ribs are shown, the number of ribs can vary in other embodiments. Cap 106 is designed to couple with ribs 116a, 116b, 116c, and 116d such that connector 110 is positioned in opening 108. This will be shown and described below. Also, subassembly 112 can be positioned into enclosure 102. In order to position subassembly 112 within enclosure 102, enclosure 102 may include several guide rails integrated with the walls of enclosure 102 such that circuit board 114 electrically couples with electrical springs within enclosure 102. This will also be shown and described below.

Figure 3:
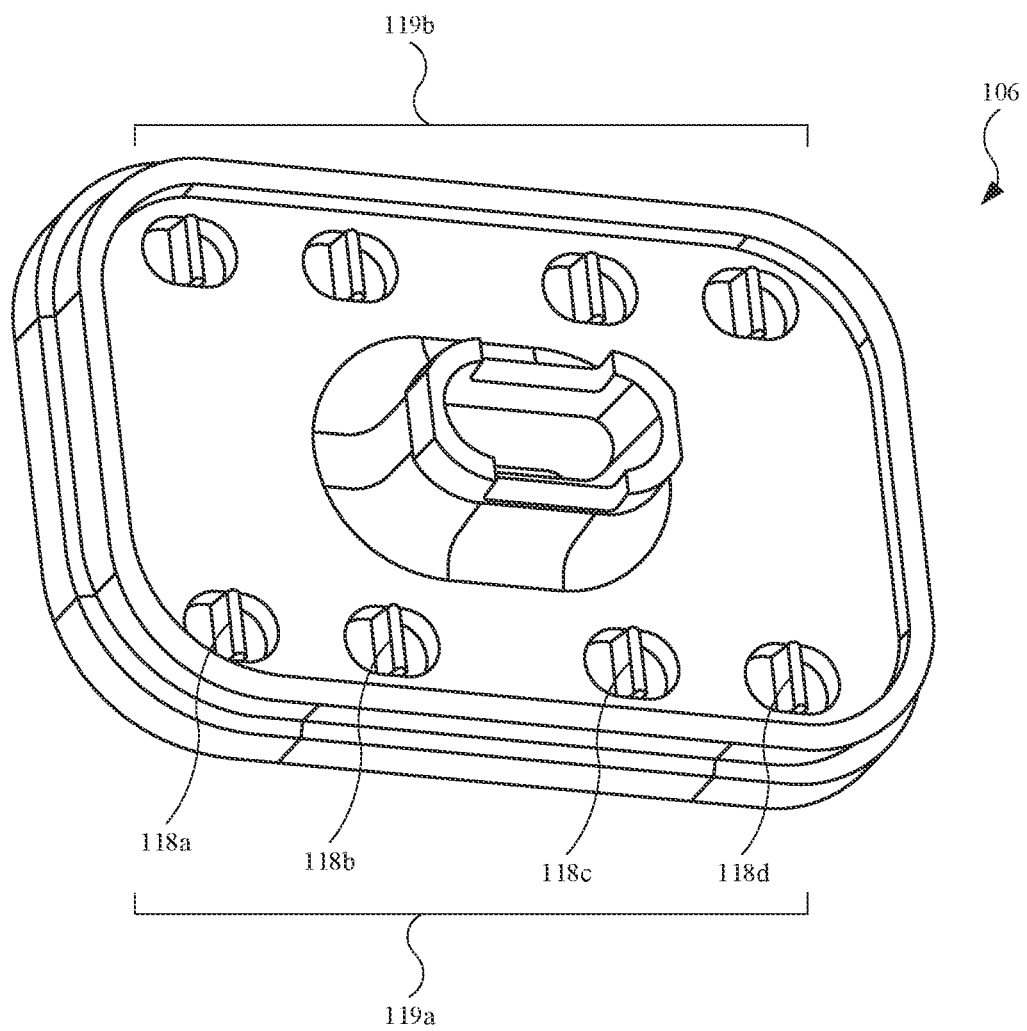
FIG. 3 illustrates an isometric view of the cap, showing several fins of the cap.

FIG. 3 illustrates an isometric view of cap 106, showing several fins of cap 106. As shown, cap 106 includes a fin 118a, a fin 118b, a fin 118c and a fin 118d. Each of fins 118a, 118b, 118c, and 118d extends from an internal surface of cap 106. Also, each of fins 118a, 118b, 118c, and 118d are designed to interlock with circuit board 114 (shown in FIG. 2). For example, fins 118a, 118b, 118c, and 118d (representing a row of fins 119a) can interlock with ribs 116a, 116b, 116c, and 116d (shown in FIG. 2), respectively, of circuit board 114 (shown in FIG. 2). In this regard, a welding operation, such as an ultrasonic welding operation, can provide thermal energy that melts (and subsequently bonds) fins 118a, 118b, 118c, and 118d to ribs 116a, 116b, 116c, and 116d, respectively. Cap 106 (including fins 118a, 118b, 118c, and 118d) enclosure 102 (shown in FIG. 2) may each include a thermoplastic material, and accordingly, cap 106 and enclosure 102 may include the same (or at least substantially similar) melting temperature. In this regard, the aforementioned welding operation can supply heat sufficient to melt fins 118a, 118b, 118c, and 118d, while melting enclosure 102 and cap 106 together at selected regions (shown below). Further, the thermoplastic material may include a melting temperature that is lower than the material (e.g., FR4) of circuit board 114 (including ribs 116a, 116b, 116c, and 116d), and accordingly, the same welding operation may not melt, or cause damage to, circuit board 114. In addition to row of fins 119a, cap 106 may include a row of fins 119b, thus providing a symmetric design (internally) for cap 106. In this manner, either of rows of fins 119a or 119b can be used such that the assembly process does not require a specific orientation of cap 106 during assembly.

Figure 4:
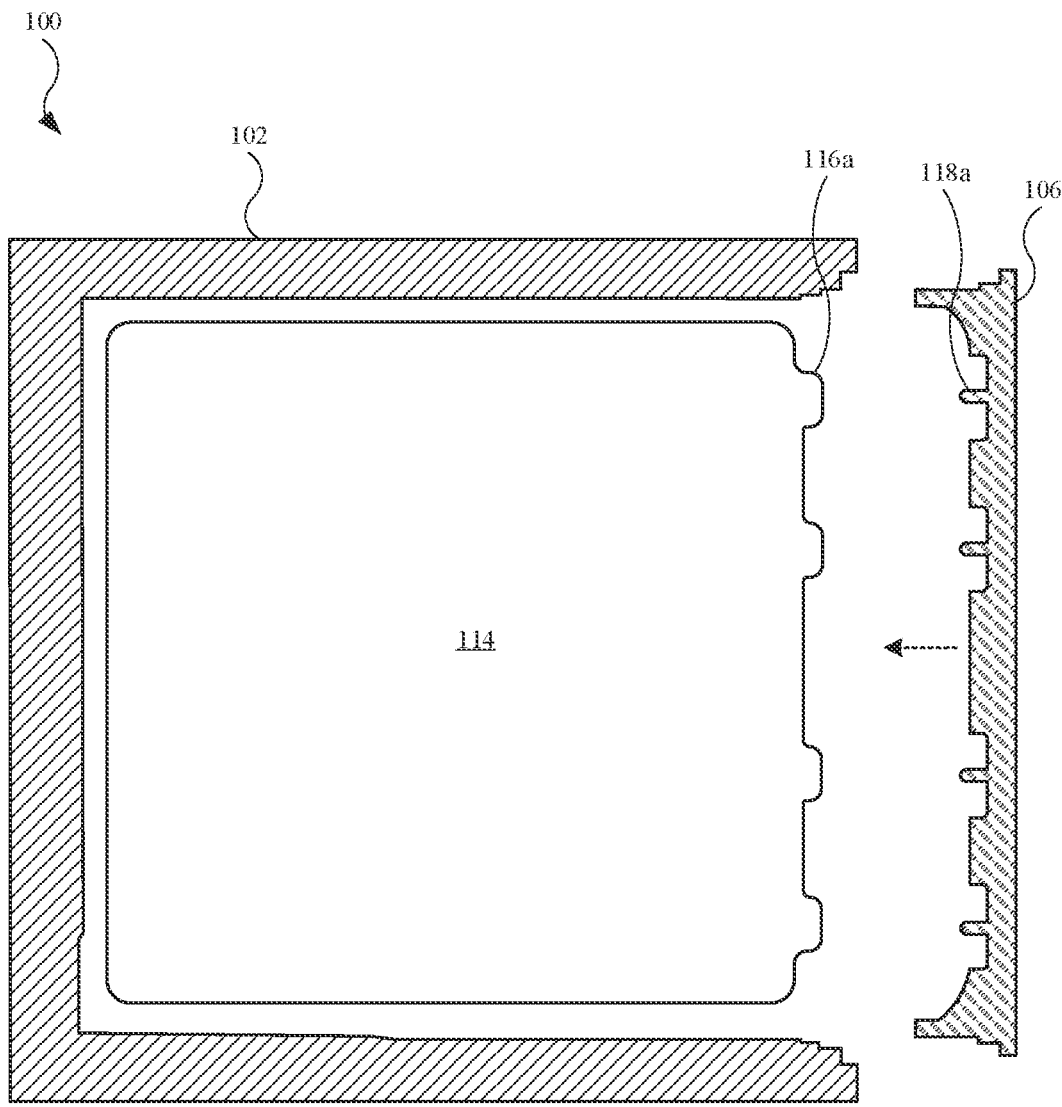
FIG. 4 illustrates a partial cross sectional view of the power adapter, showing the cap prior to assembly with the enclosure.

FIG. 4 illustrates a partial cross sectional view of power adapter 100, showing cap 106 prior to assembly with enclosure 102. Cap 106 can be brought toward, and engaged with, enclosure 102. In order to permanently secure cap 106, the aforementioned fins (shown in FIG. 3) can be brought into contact with each of the aforementioned ribs (labeled in FIG. 2) of circuit board 114, where a welding operation can subsequently melt the fins to the ribs. For instance, fin 118a (representative of additional fins) can be brought into contact with rib 116a (representative of additional ribs) and subsequently melted to rib 116a when sufficient thermal energy is provided to melt fin 118a. Additional welding operations may occur, and will be further discussed below.

Alternatively, in some embodiments, circuit board 114 includes a material (e.g., plastic) capable of melting during an assembly operation. For example, rib 116a (as well as one or more of the additional ribs) may include plastic, and the ultrasonic welding operation melts fin 118a onto the plastic on rib 116a. As a result, rib 116a is melted to circuit board 114. In this regard, the resultant joint may include enhanced strength.

Figure 5:
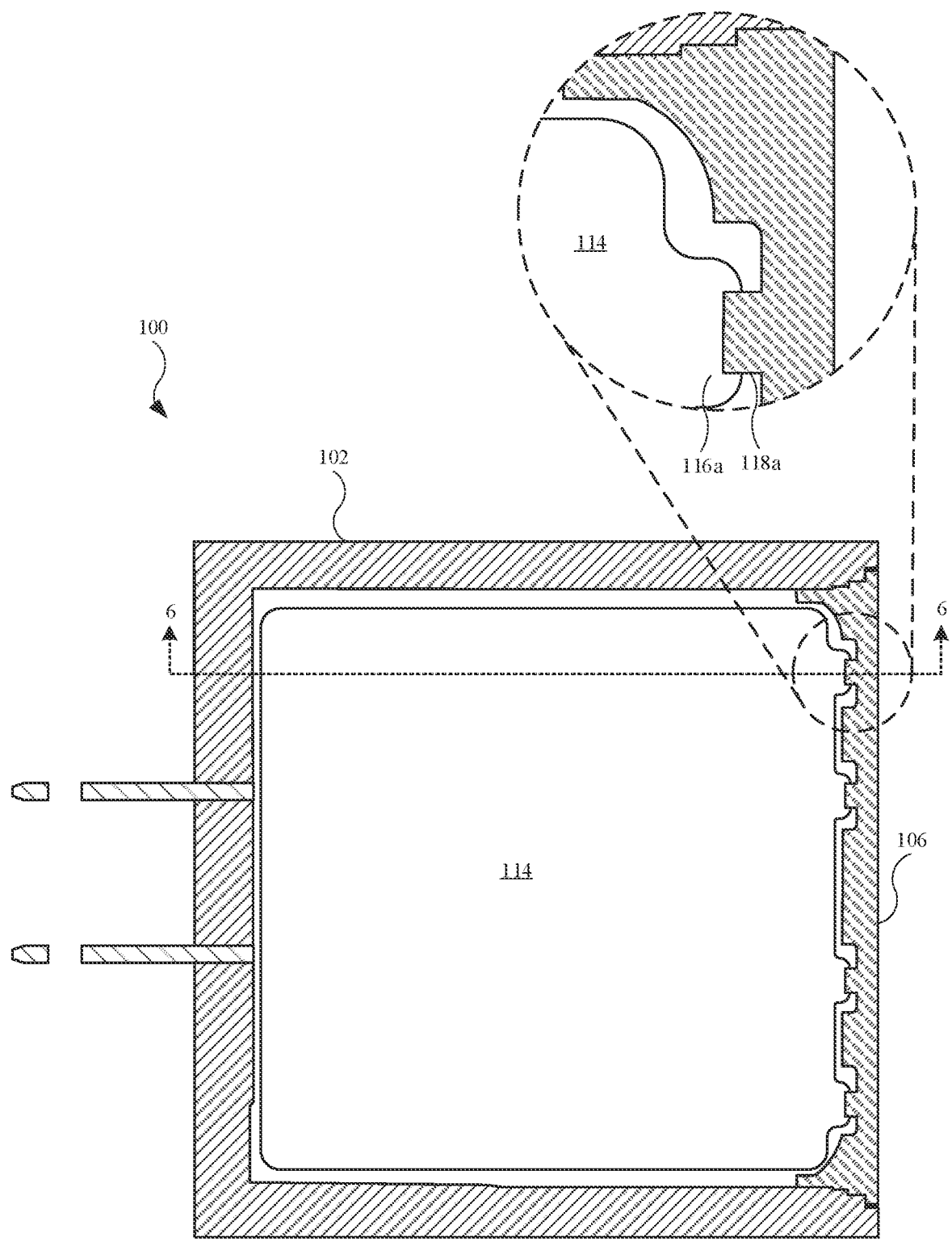
FIG. 5 illustrates a partial cross sectional view of the power adapter, showing the cap assembled with the enclosure and the fins interlocked with the ribs of the circuit board.

FIG. 5 illustrates a partial cross sectional view of power adapter 100, showing cap 106 assembled with enclosure 102 and the fins of cap 106 interlocked with the ribs of circuit board 114. As shown in the enlarged view, fin 118a (representative of the remaining fins) is interlocked with circuit board 114 at rib 116a (representative of the remaining ribs). During a welding operation, fin 118a can melt, or at least partially melt, thereby allowing the rib 116a to penetrate fin 118a. Further, circuit board 114, including the ribs, includes a relatively higher melting temperature, and accordingly, circuit board 114 will not melt, deform, or become damaged during the welding operation. The process shown and described can eliminate the need for adhesives (or at least reduce the amount of adhesive required) to secure cap 106 with enclosure 102, and provide an accurate position of circuit board 114 within enclosure 102. Also, as compared to some polymers used in plastic housing parts for adapters, cap 106 may include a material (or materials) having a melting temperature sufficiently high enough to undergo a welding operation, while not allowing the melted regions of cap 106 (i.e., fins) to flow/extend into undesired locations, resulting in a more controlled welding operation in terms of regulating/controlling the flow of melted material.

Figure 6:
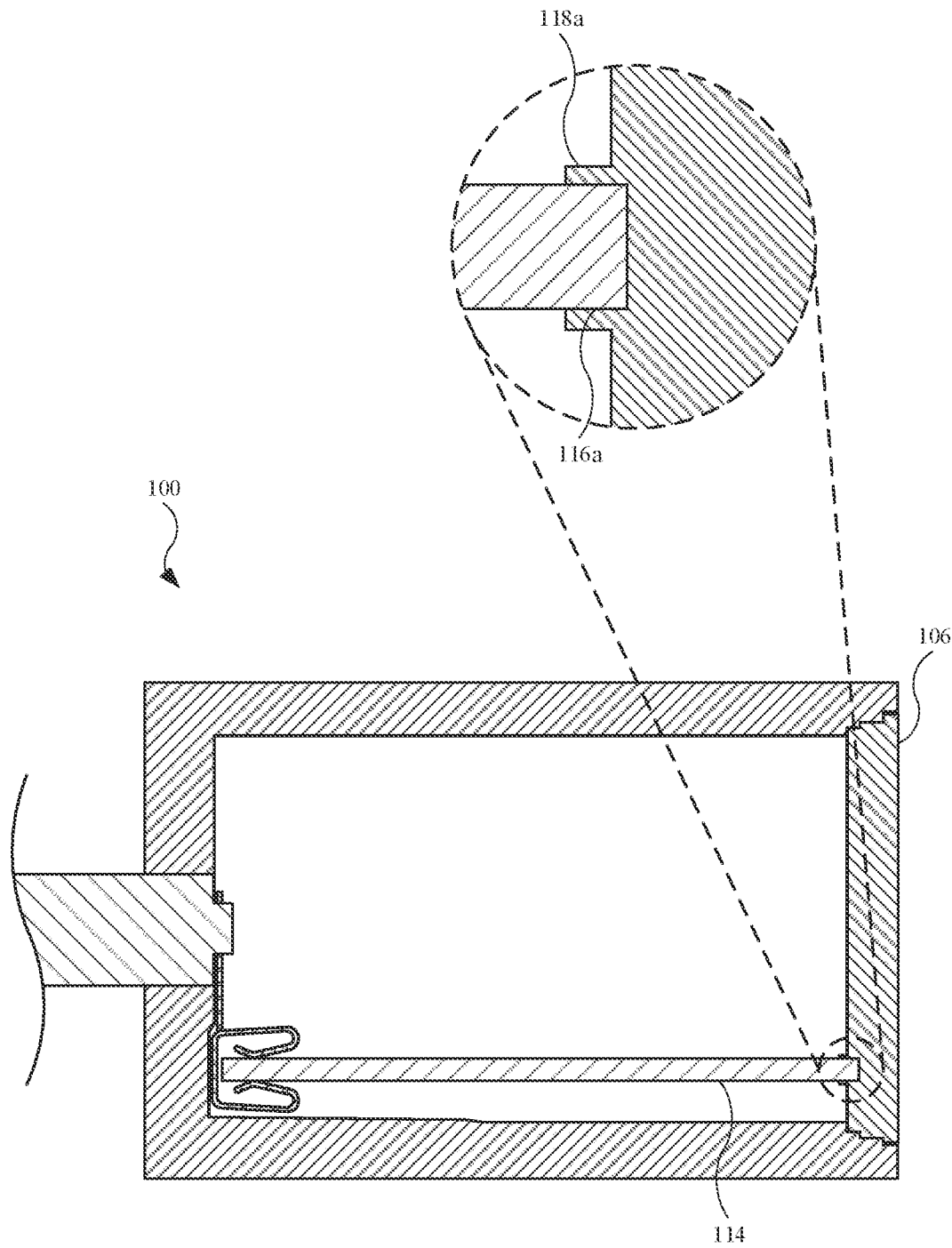
FIG. 6 illustrates a partial cross sectional view of the power adapter shown in FIG. 5, taken along line 6-6, showing the fin interlocked with the circuit board.

FIG. 6 illustrates a partial cross sectional view of power adapter 100 shown in FIG. 5, taken along line 6-6, showing fin 118a interlocked with circuit board 114. As shown in the enlarged view, fin 118a is deformed due in part to the aforementioned welding operation. In particular, as a result of the welding operation, fin 118a (representative of additional fins) generally conforms to the exterior shape of rib 116a (representative of additional ribs). While fin 118a, formed from a thermoplastic, melts, circuit board 114, formed from a thermoset (e.g., FR4), does not. Also, the melting of fin 118a to circuit board 114 removes any gaps or spaces between fin 118a and circuit board 114. In this regard, the combination of the interference fit between cap 106 and circuit board 114 and welding operation to melt fin 118a causes fin 118a to conform to the exterior shape and size of circuit board 114, providing additional constraint to circuit board 114.

Figure 7:
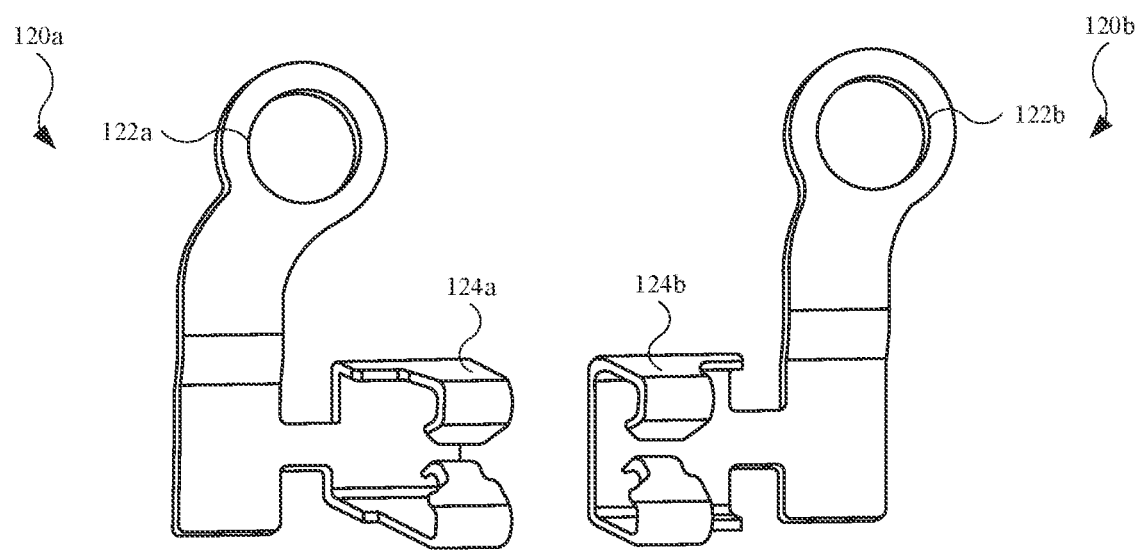
FIG. 7 illustrates an isometric view of electrical springs, in accordance with some described embodiments.

FIG. 7 illustrates an isometric view of electrical springs, in accordance with some described embodiments. Power adapter 100 (shown in FIG. 1) may include an electrical spring 120a and an electrical spring 120b disposed in enclosure 102 (not shown in FIG. 7). Electrical springs 120a and 120b may be referred to as a first electrical spring and a second electrical spring, respectively. Electrical springs 120a and 120b are designed to electrically couple with prongs 111a and 111b (shown in FIG. 1), respectively. In this regard, electrical springs 120a and 120b may be formed from a metal (or metals), such as copper or an alloy including copper. Electrical springs 120a and 120b may include an opening 122a and an opening 122b, respectively. Openings 122a and 122b can receive a portion of prongs 111a and 111b (shown in FIG. 1), respectively. Additionally, electrical springs 120a and 120b are designed to electrical couple with circuit board 114 (shown in FIG. 2). In this regard, electrical springs 120a and 120b include a clamp 124a and a clamp 124b, respectively. Clamps 124a and 124b are flexible clamps with a shape and spring constant to provide a contact force to couple with circuit board 114, and engage electrical pads (not shown in FIG. 7) of circuit board 114. Also, the general position and orientation of electrical springs 120a and 120b, as shown in FIG. 7, is the position and orientation of electrical springs 120a and 120b when disposed in enclosure 102 (not in FIG. 7). In this regard, electrical springs 120a and 120b may be symmetrically orientated within enclosure 102. The symmetric orientation and the integration of electrical springs 120a and 120b also provide a constraint on circuit board 114. As a result, power adapter 100 (shown in FIG. 1) need not rely on adhesives and fasteners for these connections.

Figure 8:
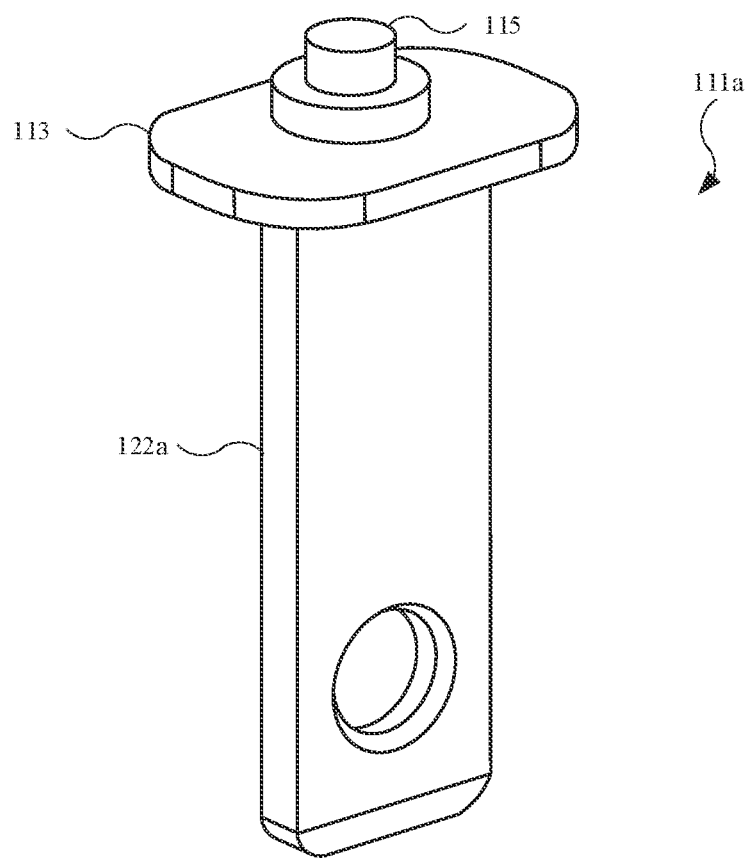
FIG. 8 illustrates an isometric view of a prong, in accordance with some described embodiments.

FIG. 8 illustrates an isometric view of prong 111a, in accordance with some described embodiments. As shown, prong 111a is a single piece material. In some embodiments, prong 111a is formed through an extrusion process. In the embodiment shown in FIG. 8, prong 111a is formed from cold forging, which may increase the overall strength of prong 111a. Prong 111a may include a flange 113. In order to secure prong 111a with enclosure 102 (shown in FIG. 1), flange 113 can be secured to enclosure 102 by a molding operation, such as insert molding, thereby embedding flange 113 in enclosure 102. As a result, prong 111a is less susceptible to decoupling from enclosure 102 due to mechanical stress. The molding operation of flange 113 into enclosure 102 creates a consistent mechanical connection between enclosure 102 and prong 111a.

Prong 111a may further include a post 115 that connects with an electrical spring. For example, post 115 can mate with opening 122a of electrical spring 120a (shown in FIG. 7). Post 115 can be formed by a variety of methods, such as orbital swaging, which can form a robust electrical connection. It should be noted that prong 111b (shown in FIG. 1) may include any features described herein for prong 111a.

Figure 9:
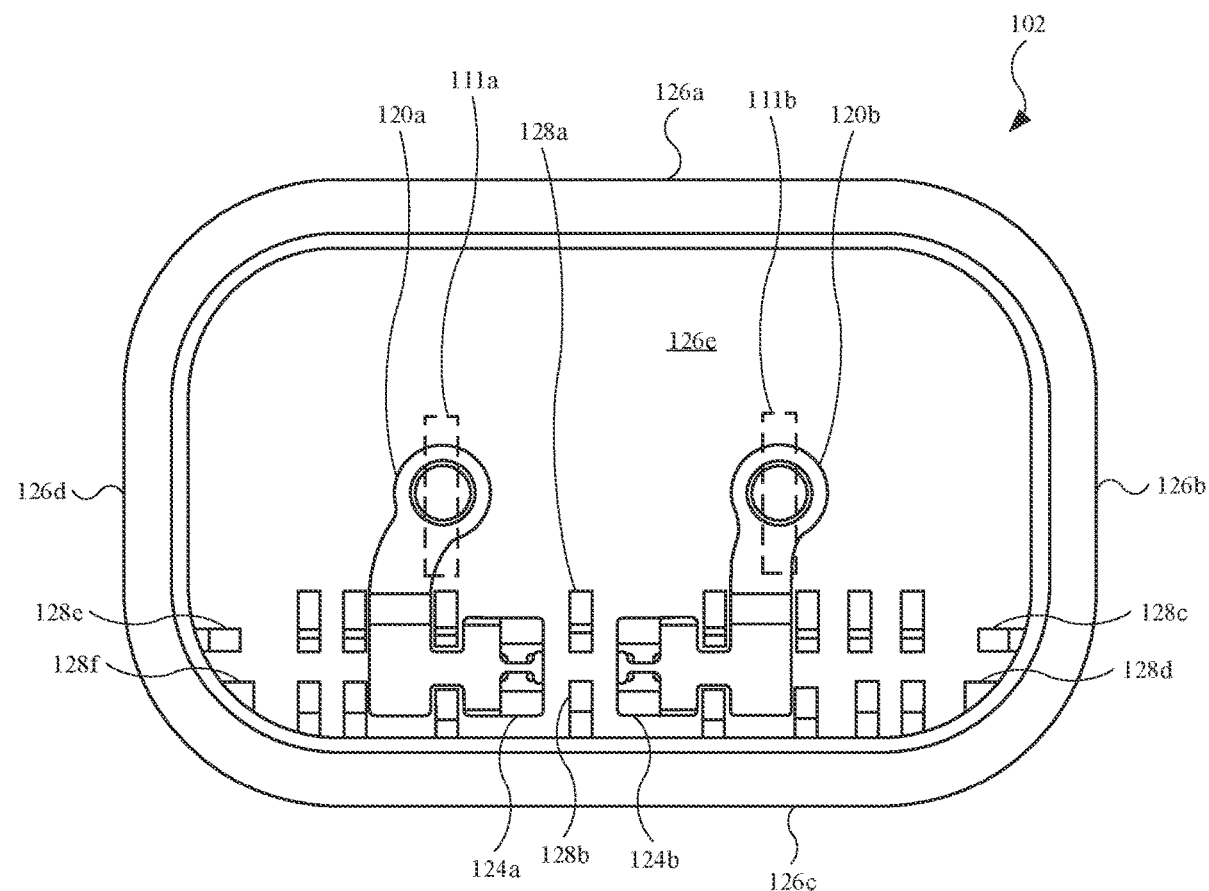
FIG. 9 illustrates a plan view of the enclosure, showing the electrical springs and internal features of the enclosure.

FIG. 9 illustrates a plan view of enclosure 102, showing electrical springs 120a and 120b and other features within enclosure 102. Enclosure 102 may include several walls. As shown, enclosure 102 includes a wall 126a, a wall 126b, a wall 126c, a wall 126d, and a wall 126e. Based on the design of enclosure 102, wall 126e may be perpendicular with respect to each of walls 126a, 126b, 126c, and 126d. Electrical springs 120a and 120b may be disposed against a surface of wall 126e, and are electrically and mechanically coupled to prongs 111a and 111b, respectively. Also, enclosure 102 includes several guide rails used to support and position circuit board 114 (shown in FIG. 2) within enclosure 102. For example, enclosure 102 includes a guide rail 128a, representing several additional guide rails positioned on wall 126e. Additionally, enclosure 102 includes a guide rail 128b, representing several additional guide rails positioned on wall 126c and/or wall 126e. Also, enclosure 102 may include a guide rail 128c and a guide rail 128d disposed at a corner of enclosure 102, as well as a guide rail 128e and a guide rail 128f disposed at another corner of enclosure 102. When circuit board 114 is inserted into enclosure 102, circuit board 114 is directed to electrical springs 120a and 120b based on the aforementioned guide rails. For instance, circuit board 114, when inserted into enclosure 102, is positioned between guide rails 128c and 128d, as well as between guide rails 128e and 128f. Subsequently, circuit board 114 is further guided by, and positioned between guide rails 128a and 128b, which further direct circuit board 114 to electrical springs 120a and 120b, where circuit board 114 is guided into engagement with clamps 124a and 124b.

Figure 10:
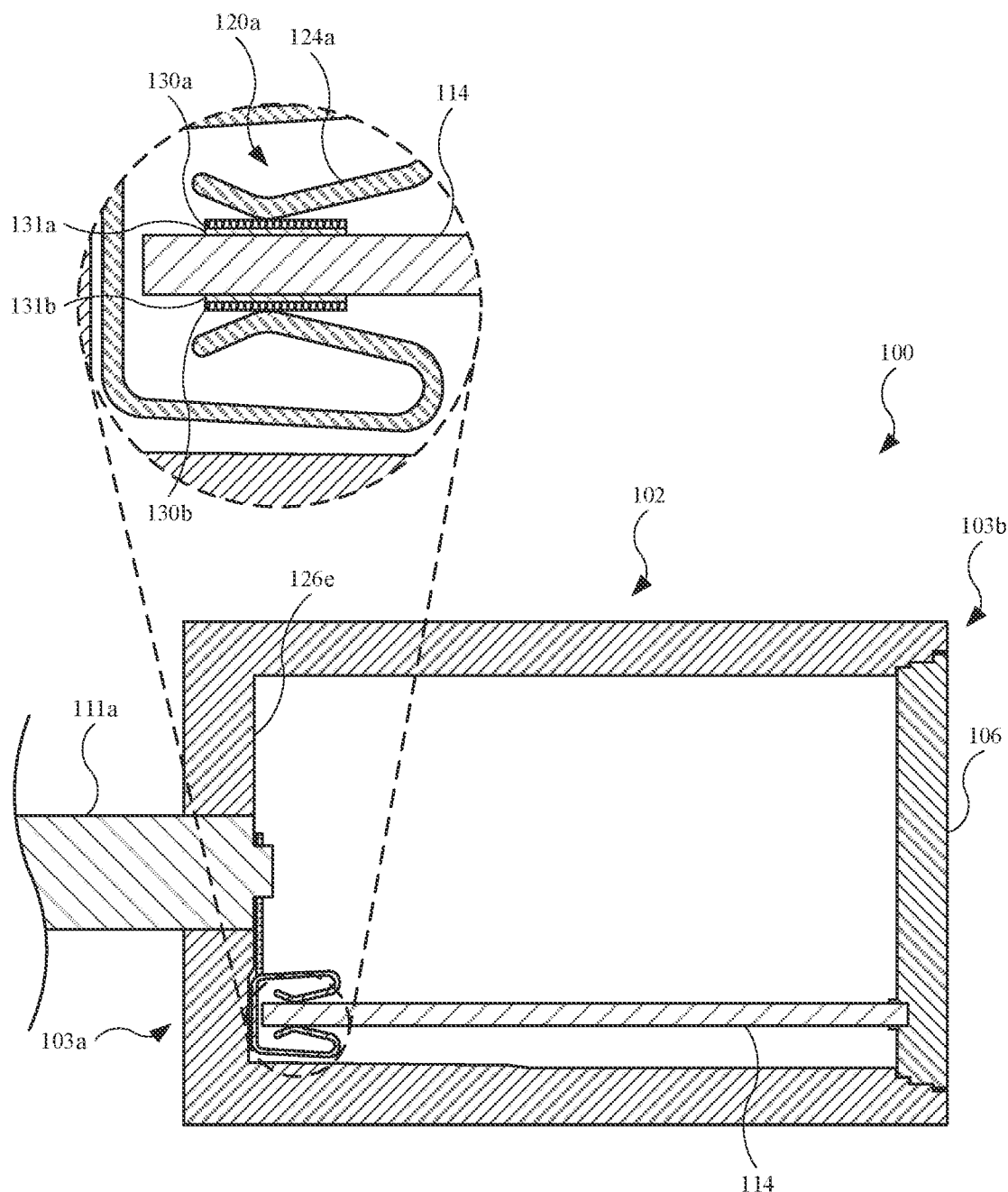
FIG. 10 illustrates a cross sectional view of the power adapter, showing the circuit board positioned in the enclosure.

FIG. 10 illustrates a cross sectional view of power adapter 100, showing circuit board 114 positioned in enclosure 102. The electrical springs can electrically couple with the circuit board 114. For example, as shown in the enlarged view, electrical spring 120a, using clamp 124a, electrically couples with an electrical pad 130a and an electrical pad 130b of circuit board 114, thereby electrically coupling prong 111a to circuit board 114. Additionally, as shown in FIG. 10, nickel shims 131a and 131b can be positioned between circuit board 114 and electrical pads 130a and 130b, thereby increasing the hardness and wear resistance at the respective interfaces. It should be noted that the electrical spring 120b and clamp 124b (shown in FIG. 7) may couple with circuit board 114, electrically and mechanically, in a manner similar to that of electrical spring 120a (i.e., with electrical pads of circuit board 114), and may electrically couple to prong 111b (shown in FIG. 1). Further, electrical connections that see strain from wall 126e to the circuit board 114 are solder-less. In other words, solder is not used at these locations. Rather, the electrical connections include high-pressure, electro-mechanical connections to increase strength of the electrical connections, as compared to solder.

Additionally, the aforementioned ultrasonic welding operation, known to provide energy with a frequency of approximately 20 kHz, is not required at a connection point between the circuit board 114 and electrical spring 120a (nor electrical spring 120b). In other words, the welding operation may be limited to securing cap 106 (shown in FIG. 3) at end 103b of the enclosure 102 that is away from the electrical springs 120a and 120b (both generally associated with end 103a of enclosure 102). As a result, electrical springs 120a and 120b, as well as other components of subassembly 112 (shown in FIG. 2) are prevented from, or at least less susceptible to, damage or other issues during ultrasonic welding operation.

FIGS. 7-10 show and describe several features used of power adapter 100 used to facilitate assembly of components. For instance, the design of guide rails 128a, 128b, 128c, 128d, 128e, and 128f guide circuit board 114 to electrical springs 120a and 120b, thereby providing a "blind" mating in which visual assembly is not required. Additionally, the blind mating process may remove the need for wiring and tooling. In this manner, power adapter 100 can be made more safely and efficiently, as well as in a more cost effective manner.

Figure 11:
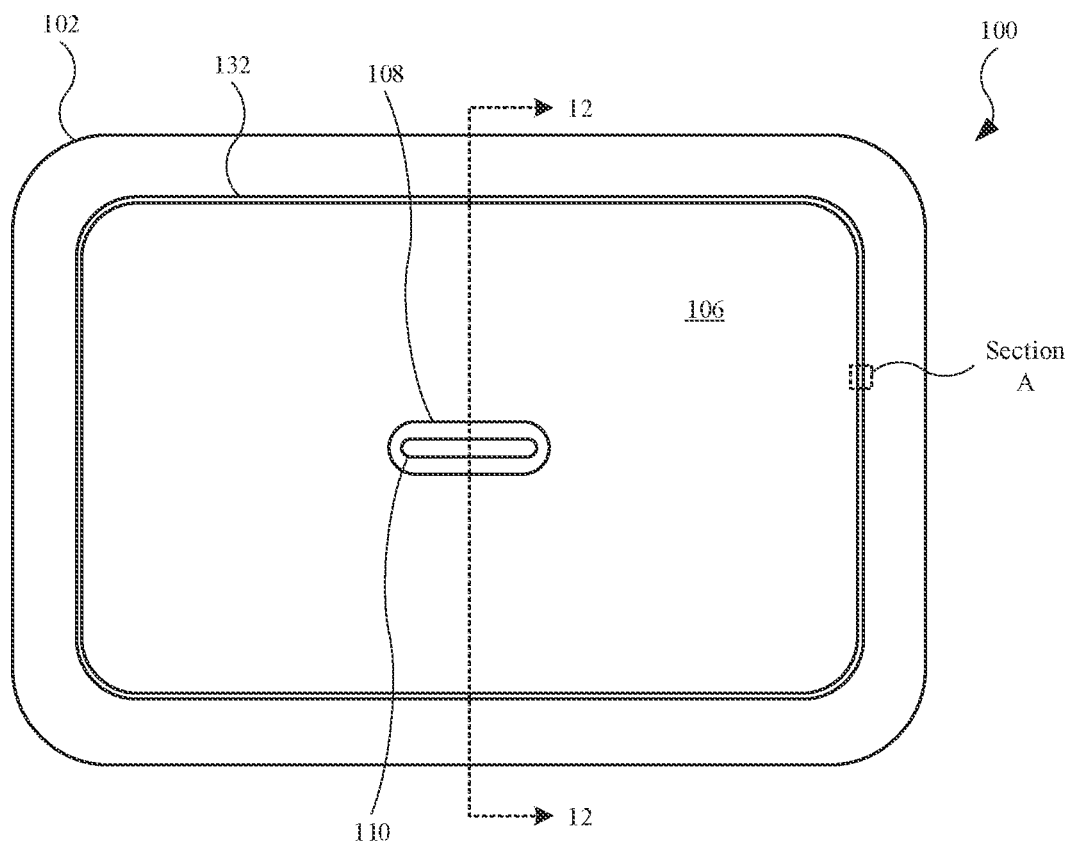
FIG. 11 illustrates a plan view of the power adapter, showing relationships between the enclosure and the cap, as well as between the cap and the connector.

FIG. 11 illustrates a plan view of power adapter 100, showing relationships between enclosure 102 and cap 106, as well as between cap 106 and connector 110. Ideally, when cap 106 is secured with enclosure 102, cap 106 is centered within an opening 132 of enclosure 102. As a result, the gap between cap 106 and enclosure 102 is uniform. Similarly, the aforementioned assembly ideally centers connector 110 within opening 108 of cap 106.

Figure 12:
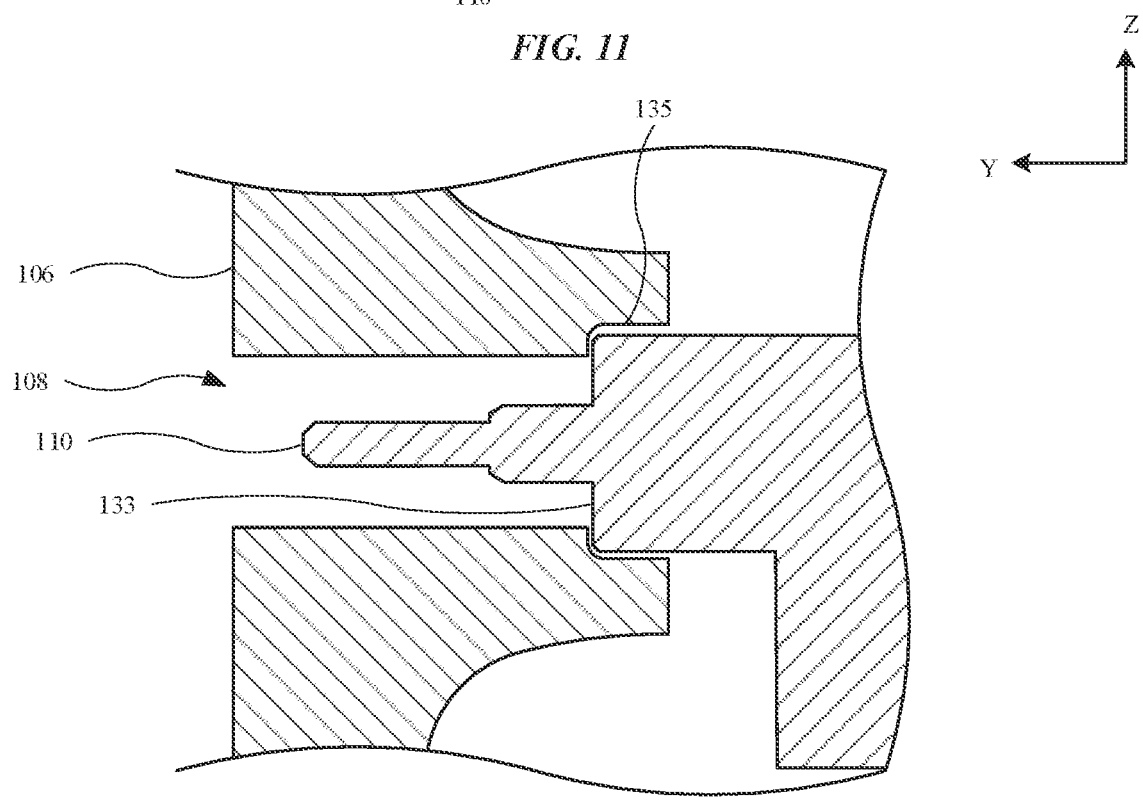
FIG. 12 illustrates a cross sectional view of the power adapter shown in FIG. 11, taken along line 12-12, showing a relationship between the connector and the opening of the cap.
Figure 13:
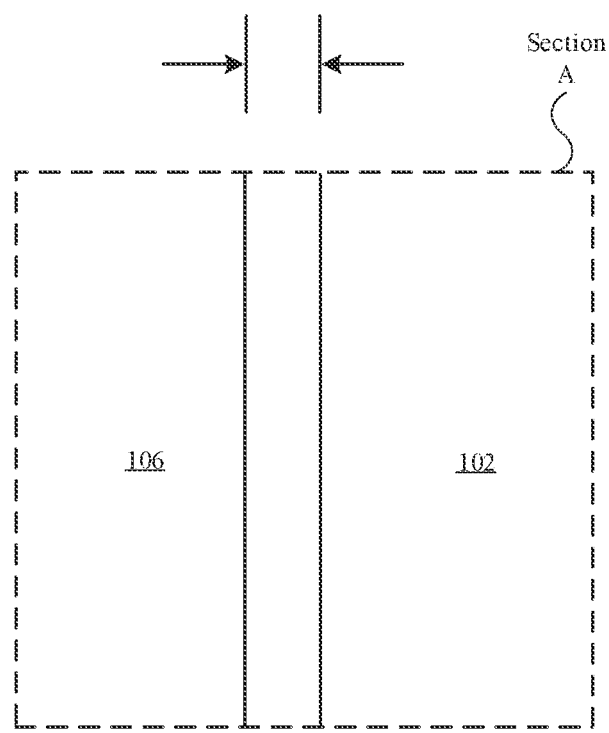
FIG. 13 illustrates a plan view of the power adapter shown in FIG. 11, showing an enlarged view of Section B shown in FIG. 11.

FIG. 12 illustrates a cross sectional view of power adapter 100 shown in FIG. 11, taken along line 12-12, showing a relationship between connector 110 and opening 108 of cap 106. As shown, at least some regions of connector 110 are larger than the size of opening 108 of cap 106. For example, connector 110 includes an extended region 133 that includes dimensions (e.g., Z-axis and X-axis, the latter of which is not shown in FIG. 12) that are larger than corresponding dimensions of opening 108. Additionally, opening 108 of cap 106 is further defined by a chamfered region 135 that allows a portion of connector 110 (e.g., extended region 133) to be further positioned into opening 108 along the Y-axis (as opposed to opening 108 without chamfered region 135). Based on these dimensional relationships, when viewing an exterior surface of cap 106 and connector 110 (such as the viewpoint shown in FIG. 11), there is generally no gap between opening 108 and connector 110, thus providing a seamless appearance at an interface between opening 108 and connector 110. Further, FIG. 13 illustrates a plan view of power adapter 100 shown in FIG. 11, showing an enlarged view of Section B shown in FIG. 11. As shown, a gap (denoted by arrows) extends between enclosure 102 and cap 106, and defines a consistent dimension between enclosure 102 and cap 106.

In order to provide power adapter 100 with consistent and repeatable gaps (shown in FIGS. 11-13), power adapter 100 may include some modifications that allow for adjustments during assembly. These adjustments may offset tolerance variations commonly known for fabricated parts.

Figure 14:
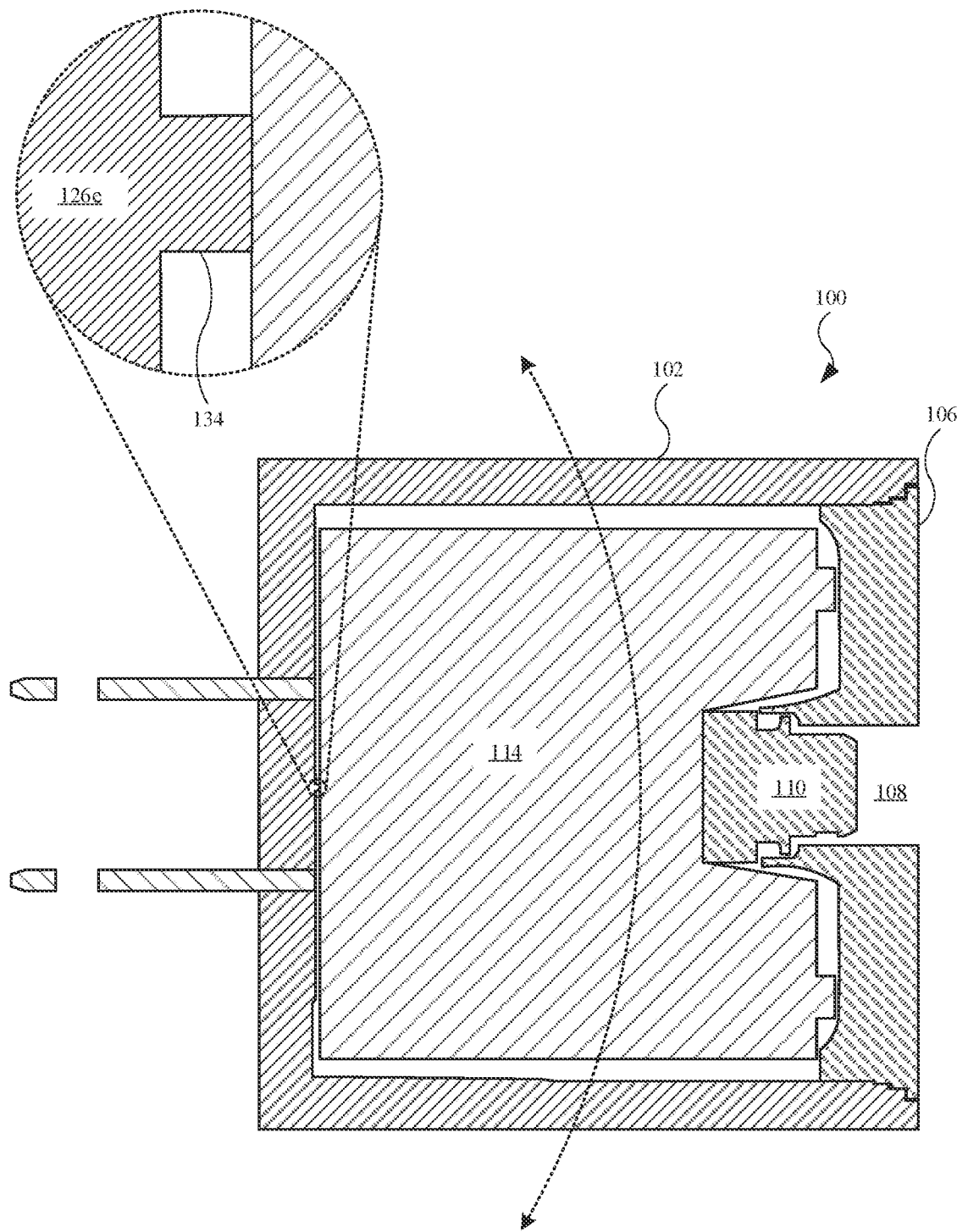
FIG. 14 illustrates a cross sectional view of the power adapter, showing the relative movement capabilities of the circuit board and the connector during assembly between the cap and the enclosure.

FIG. 14 illustrates a cross sectional view of power adapter 100, showing the relative movement capabilities of circuit board 114 and connector 110 during assembly between the cap 106 and the enclosure 102. As shown in the enlarged view, enclosure 102 includes an extension 134 that extends from wall 126e. Extension 134 may include a rib integrated with wall 126e. Extension 134 defines a pivot point for circuit board 114. In other words, in some instances, circuit board 114 may directly contact enclosure 102 at extension 134 along the wall 126e, and in some instances, circuit board 114 directly contacts enclosure 102 only at extension 134. As a result, circuit board 114 (including connector 110) can move in at least two directions, as denoted by the two-sided arrow prior to cap 106 being permanently secured with enclosure 102. In this manner, movement of circuit board 114 can provide an adjustment to cap 106 to center cap 106 with respect to enclosure 102, and connector 110 can be also centered within opening 108 of cap 106. As a result, connector 110 does not require a flexible circuitry or additional wiring for flexibility/movement during assembly, as the connector 110 moves with circuit board 114 for adjustment (of connector 110).

Figure 15:
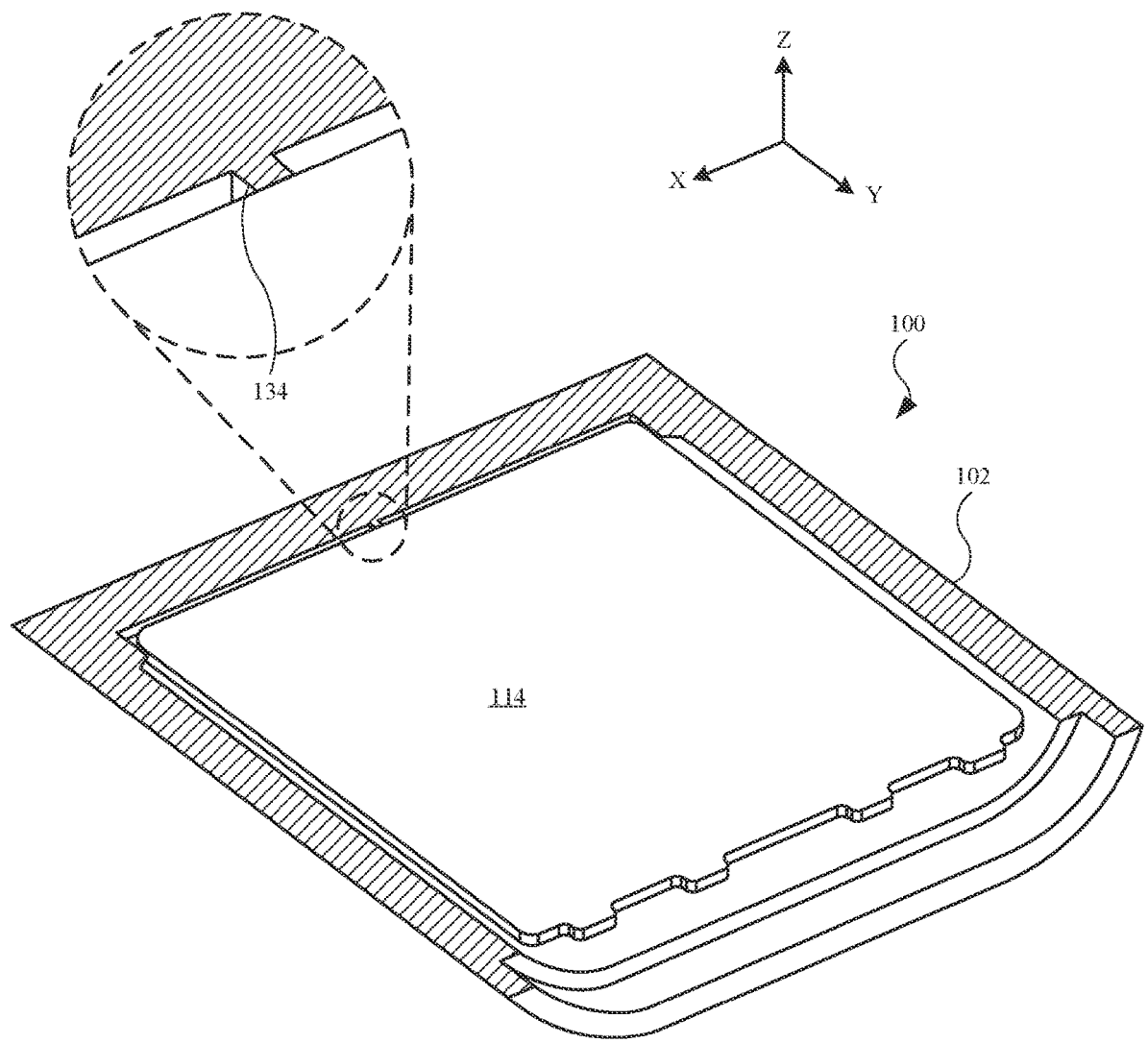
FIG. 15 illustrates a partial cross sectional view of the power adapter, showing additional movement capabilities of the circuit board during assembly between the cap and the enclosure.

FIG. 15 illustrates a partial cross sectional view of power adapter 100, showing additional movement capabilities of circuit board 114 during assembly between cap 106 and enclosure 102. Not only is circuit board 114 capable of pivoting, relative to the enclosure 102, along a two-dimension X-Y plane, but circuit board 114 can also use extension 134 to move along the Z-axis if necessary. The degree of pivoting is approximately in the range of 4 to 8 degrees along each axis. This allows sufficient, but limited, degree of movement for circuit board 114, if needed. While electrical springs 120a and 120b (shown in FIG. 7) provide mechanical constraints to circuit board 114, electrical springs 120a and 120b nonetheless permit movement of circuit board 114 in three dimensions. Also, due in part of the ability of circuit board 114 to adjust in three different dimensions, connector 110 (shown in FIG. 14) can also move in three dimensions, as connector 110 is mounted to circuit board 114.

Figure 16:
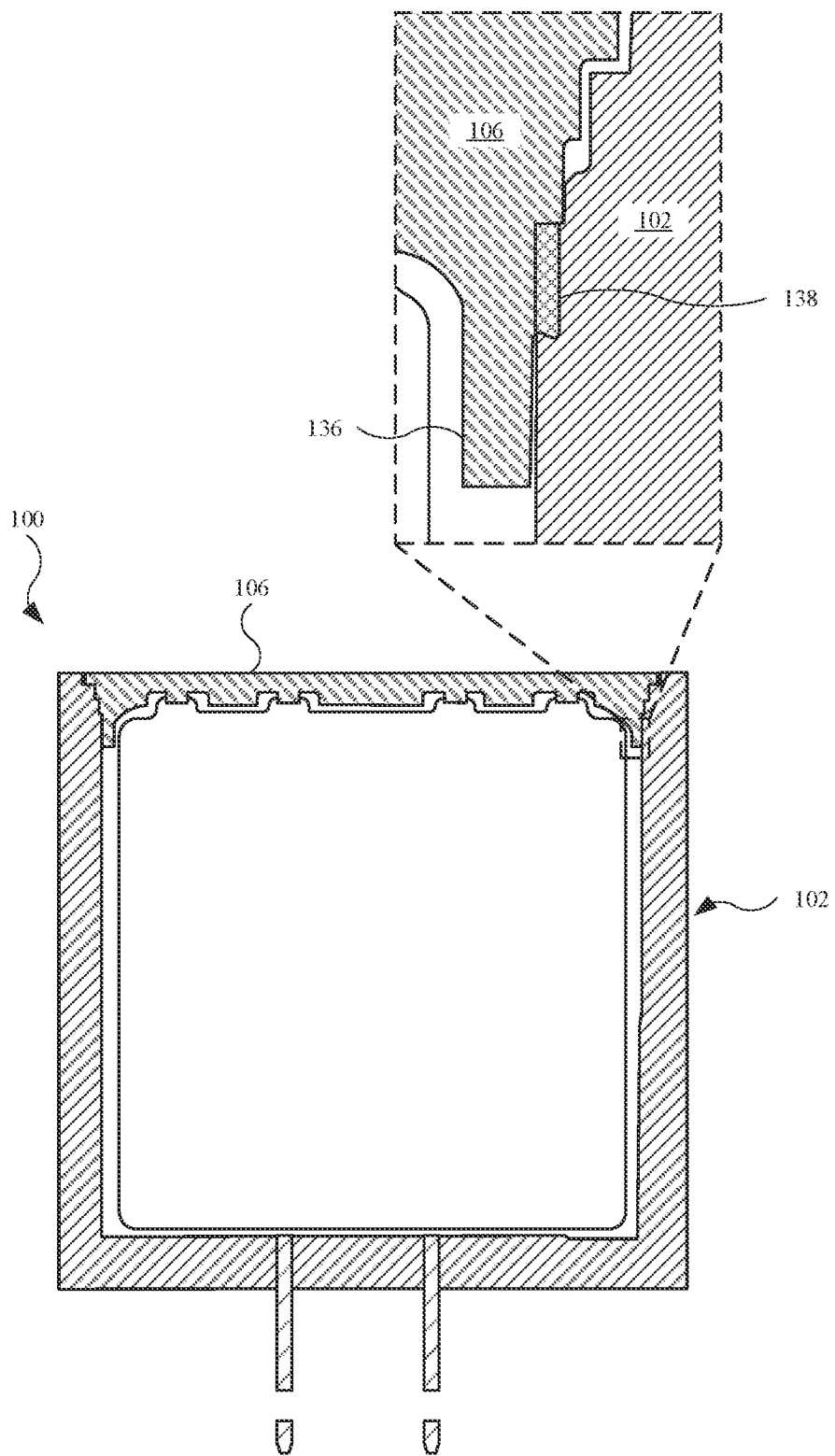
FIG. 16 illustrates a cross sectional view of the power adapter, showing the cap having an extension.

FIG. 16 illustrates a cross sectional view of power adapter 100, showing cap 106 having an extension 136. Extension 136 defines a flange that includes a ring around an inner surface of cap 106. Extension 136 provides additional surface area for bonding, through ultrasonic welding (as an example), cap 106 with enclosure 102. In this regard, extension 136 can promote a stronger bond to increased space/volume for bonding, and accordingly, is less susceptible to failure. Moreover, extension 136 may shield, or hide, any melted or otherwise deformed materials during the ultrasonic welding process. For instance, as shown in the enlarged view, cap 106 is secured with enclosure 102 at a bonding location 138, defined by the aforementioned ultrasonic welding operation. Despite variances or differences caused by the ultrasonic welding operation to cap 106 and/or enclosure 102, extension 136 not only increases the area for bonding location 138, but also masks or hides any cosmetic deficiencies caused at bonding location 138. Additionally, the energy required by the welding operation is minimized, as compared to the resultant increased weld strength, based in part on extension 136. Also, bonding location 138 may limit or eliminate the need for adhesives to bond cap 106 with enclosure 102.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A power adapter for electronic devices, the power adapter comprising:
   an enclosure that defines an internal volume;
   a circuit board located in the internal volume, the circuit board comprising a plurality of ribs; and
   a cap comprising a plurality of fins, wherein each of plurality of ribs is attached to a respective fin of the plurality of fins.

2. The power adapter of claim 1, further comprising:
   a first electrical spring electrically coupled to a first electrical pad of the circuit board; and
   a second electrical spring electrically coupled to a second electrical pad of the circuit board.

3. The power adapter of claim 2, wherein the enclosure comprises:
   a first guide rail; and
   a second guide rail, and where the circuit board coupled to the first electrical spring and
      the second electrical spring based on the first guide rail and the second guide rail.

4. The power adapter of claim 3, wherein the enclosure comprises:
   a first wall, wherein the first guide rail is located on the first wall; and
   a second wall, wherein the second guide rail is located on the second wall.

5. The power adapter of claim 4, further comprising an extension that extends from the first wall, the extension defining a pivot point in contact with the circuit board.

6. The power adapter of claim 4, wherein:
   the first wall defines a first end of the enclosure,
   the enclosure includes an opening that defines a second end opposite the first end, and
   the cap is positioned in the opening.

7. The power adapter of claim 1, further comprising a connector, wherein in the cap includes a cap opening, and the connector is positioned in the cap opening.

8. A power adapter for electronic devices, the power adapter comprising:
   an enclosure that defines an internal volume, the enclosure comprising a first wall and a second wall;
   an electrical spring secured with the first wall;
   a first guide rail extending from the first wall;
   a second guide rail extending from the second wall; and
   a circuit board positioned in the internal volume between the first guide rail and the second guide rail, the circuit board electrically coupled to the electrical spring.

9. The power adapter of claim 8, wherein the first wall is perpendicular with respect to the second wall.

10. The power adapter of claim 9, further comprising an extension that extends from the first wall, the extension defining a pivot point in contact with the circuit board.

11. The power adapter of claim 8, further comprising a prong extending from the first wall and electrically coupled with the electrical spring.

12. The power adapter of claim 8, further comprising a cap, wherein the circuit board comprises a rib, and the cap comprises a fin that is interlocked with the circuit board at the rib.

13. The power adapter of claim 12, further comprising a connector carried by the circuit board, wherein in the cap includes a cap opening, and the connector is positioned in the cap opening.

14. The power adapter of claim 12, wherein the rib comprises a thermoplastic melted to the circuit board.

15. A power adapter for electronic devices, the power adapter comprising:
   an enclosure that defines an internal volume, the enclosure comprising a first end defined by a wall and a second end defined by an opening, the second end opposite the first end;
   electrical springs coupled with the wall;
   a cap coupled with the opening, the cap comprising a cap opening;

a circuit board disposed in the internal volume and electrically coupled to the electrical springs; and a connector carried by the circuit board, the connector positioned in the cap opening.

16. The power adapter of claim 15, wherein the cap comprises a flange, and the cap is secured with the enclosure by a weld that is covered by the flange.

17. The power adapter of claim 15, wherein the circuit board comprises a rib, and the cap comprises a fin interlocked with the rib.

18. The power adapter of claim 15, wherein the enclosure comprises:

a first wall defined by the wall, wherein the electrical springs are secured with the first wall;

a second wall;

a first rail extending from the first wall; and a second rail extending from the second wall, wherein the circuit board is positioned in the internal volume between the first rail and the second rail, the circuit board electrically coupled to the electrical springs.

19. The power adapter of claim 18, further comprising a first prong and second prong, the first prong and the second prong extending from the first wall, wherein the electrical springs comprise:

a first electrical spring electrically coupled to the first prong; and a second electrical spring electrically coupled to the second prong.

20. The power adapter of claim 18, wherein the first wall is perpendicular with respect to the second wall.

\* \* \* \* \*